United States Patent
Iwata et al.

(10) Patent No.: US 9,543,469 B2
(45) Date of Patent: Jan. 10, 2017

(54) III NITRIDE SEMICONDUCTOR EPITAXIAL SUBSTRATE AND III NITRIDE SEMICONDUCTOR LIGHT EMITTING DEVICE, AND METHODS OF PRODUCING THE SAME

(71) Applicant: DOWA ELECTRONICS MATERIALS CO., LTD., Tokyo (JP)

(72) Inventors: Masatoshi Iwata, Akita (JP); Yoshikazu Ooshika, Kamisato-machi (JP)

(73) Assignee: DOWA ELECTRONICS MATERIALS CO., LTD., Tokyo (JP)

( * ) Notice: Subject to any disclaimer, the term of this patent is extended or adjusted under 35 U.S.C. 154(b) by 0 days.

(21) Appl. No.: 14/904,207

(22) PCT Filed: Aug. 6, 2014

(86) PCT No.: PCT/JP2014/071351
§ 371 (c)(1),
(2) Date: Jan. 11, 2016

(87) PCT Pub. No.: WO2015/020233
PCT Pub. Date: Feb. 12, 2015

(65) Prior Publication Data
US 2016/0172534 A1 Jun. 16, 2016

(30) Foreign Application Priority Data
Aug. 9, 2013 (JP) ................................. 2013-166377

(51) Int. Cl.
*H01L 33/06* (2010.01)
*H01L 33/12* (2010.01)
(Continued)

(52) U.S. Cl.
CPC ............. *H01L 33/06* (2013.01); *C30B 29/403* (2013.01); *C30B 29/68* (2013.01);
(Continued)

(58) Field of Classification Search
CPC ........ H01L 33/06; H01L 33/007; H01L 33/12; H01L 33/32; H01L 21/02507; H01L 21/0254
See application file for complete search history.

(56) References Cited

U.S. PATENT DOCUMENTS 8,227,284 B2 * 7/2012 Miki ................... C23C 14/0036
257/E33.025
8,421,107 B2 * 4/2013 Shinohara ............... H01L 33/16
257/98
(Continued)

FOREIGN PATENT DOCUMENTS

EP 2 615 650 A2 7/2013
JP 2004-047764 A 2/2004
(Continued)

OTHER PUBLICATIONS

Nov. 18, 2014 International Search Report issued in International Patent Application No. PCT/JP2014/071351.
(Continued)

*Primary Examiner* — Earl Taylor
(74) *Attorney, Agent, or Firm* — Oliff PLC

(57) ABSTRACT

A III nitride semiconductor epitaxial substrate having more excellent surface flatness is provided, in which the problems of crack formation and the double peaks in the shape of the EL spectrum are mitigated by employing appropriate conditions for Si doping on an AlN layer on a substrate; a III nitride semiconductor light emitting device; and methods of producing the same. A III nitride semiconductor epitaxial substrate has a substrate of which at least a surface portion
(Continued)

is made of AlN, an undoped AlN layer formed on the substrate, an Si-doped AlN buffer layer formed on the undoped AlN layer, and a superlattice laminate formed on the Si-doped AlN buffer layer. The Si-doped AlN buffer layer has an Si concentration of $2.0 \times 10^{19}/cm^3$ or more and a thickness of 4 nm to 10 nm.

8 Claims, 9 Drawing Sheets
(2 of 9 Drawing Sheet(s) Filed in Color)

(51) Int. Cl.
    *H01L 33/32*     (2010.01)
    *H01L 33/00*     (2010.01)
    *H01L 21/02*     (2006.01)
    *C30B 29/40*     (2006.01)
    *C30B 29/68*     (2006.01)
    *H01S 5/343*     (2006.01)
    *H01L 33/04*     (2010.01)

(52) U.S. Cl.
    CPC ...... *H01L 21/0254* (2013.01); *H01L 21/0262* (2013.01); *H01L 21/02458* (2013.01); *H01L 21/02507* (2013.01); *H01L 21/02576* (2013.01); *H01L 33/007* (2013.01); *H01L 33/04* (2013.01); *H01L 33/12* (2013.01); *H01L 33/32* (2013.01); *H01L 33/325* (2013.01); *H01S 5/34333* (2013.01); *H01S 2301/173* (2013.01)

(56) References Cited

U.S. PATENT DOCUMENTS 8,569,794 B2 * 10/2013 Miki ................... C23C 16/0272
                                                  257/103

2006/0121682 A1 * 6/2006 Saxler ................ H01L 29/7783
                                                  438/312
2006/0244011 A1 * 11/2006 Saxler ................ H01L 29/7783
                                                  257/194
2009/0315046 A1 * 12/2009 Miki ................... C23C 14/0036
                                                  257/94
2011/0095327 A1 * 4/2011 Shinohara ............... H01L 33/16
                                                  257/98
2011/0101391 A1 * 5/2011 Miki ................... C23C 16/0272
                                                  257/94
2012/0161152 A1 * 6/2012 Miyoshi ................ C30B 25/186
                                                  257/76
2012/0175589 A1 * 7/2012 Ooshika .................. H01L 33/32
                                                  257/13
2014/0014897 A1 * 1/2014 Kim ........................ H01L 33/06
                                                  257/13
2016/0172534 A1 * 6/2016 Iwata ...................... H01L 33/12
                                                  257/13

FOREIGN PATENT DOCUMENTS

| | | |
|---|---|---|
| JP | 2008-539587 A | 11/2008 |
| JP | 2011-205053 A | 10/2011 |
| JP | 2012-089871 A | 5/2012 |
| WO | 2011/102045 A1 | 8/2011 |
| WO | 2013/125126 A1 | 8/2013 |

OTHER PUBLICATIONS

Nov. 18, 2014 Office Action issued in Japanese Patent Application No. 2013-166377.

* cited by examiner

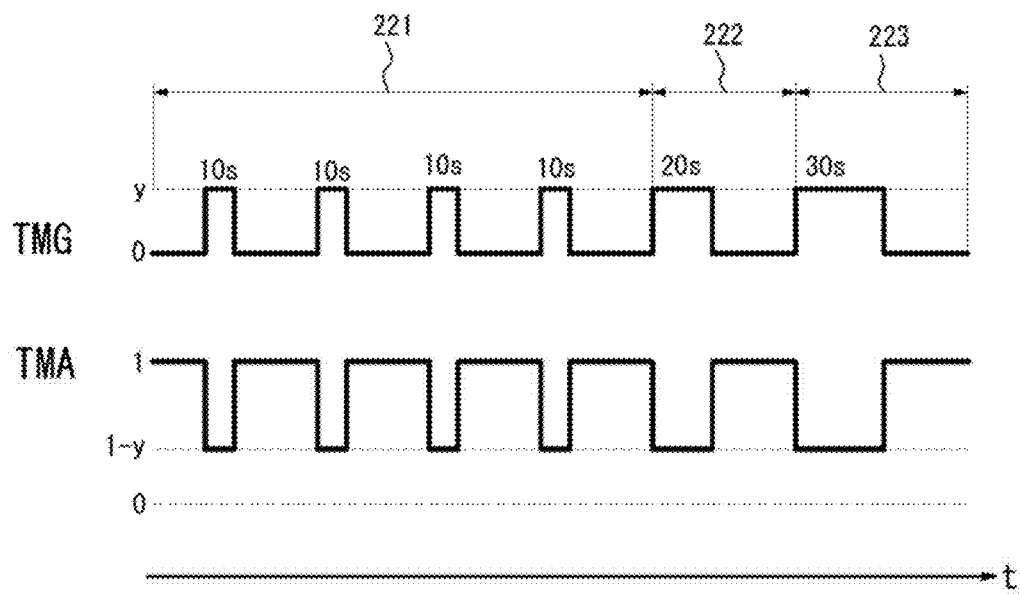
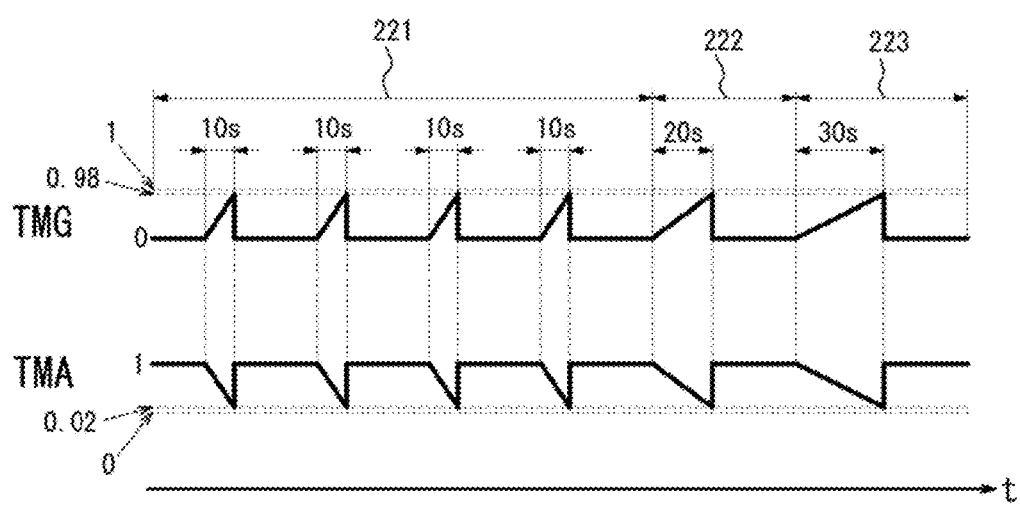

III NITRIDE SEMICONDUCTOR EPITAXIAL SUBSTRATE AND III NITRIDE SEMICONDUCTOR LIGHT EMITTING DEVICE, AND METHODS OF PRODUCING THE SAME

TECHNICAL FIELD

This disclosure relates to a III nitride semiconductor epitaxial substrate and a III nitride semiconductor light emitting device, and methods of producing the same.

BACKGROUND

In recent years, III nitride semiconductors generally made of compounds in which N is combined with Al, Ga, In, and the like are widely used for light emitting devices, elements for electronic devices, and the like. Since the characteristics of such devices largely depend on the surface is flatness of the III nitride semiconductors at the atomic level, there is a demand for techniques for growing III nitride semiconductors having excellent surface flatness.

A III nitride semiconductor is formed by performing epitaxial growth on a substrate made of sapphire, SiC, Si, GaAs, or the like. However, the lattice constant and the coefficient of thermal expansion are significantly different between the III nitride semiconductor and such a substrate. Accordingly, when a III nitride semiconductor is grown on such a substrate, for the various reasons such as the lattice mismatch and the difference in thermal expansion coefficient, the warpage of the III nitride semiconductor formed on the substrate is increased, which makes it difficult to achieve excellent surface flatness at the atomic level. In order to address the difficulty, a GaN buffer layer on the substrate is doped with Si at a high concentration to form a heavily Si-doped GaN buffer layer and a nitride semiconductor layer is formed thereon, which is known to reduce dislocations.

For example, JP 2004-047764 A (PTL 1) discloses a nitride semiconductor having a substrate, an Si-doped GaN buffer layer having an Si concentration of $4 \times 10^{19}$ cm$^{-3}$ or more on the substrate, and a nitride semiconductor layer having a crystal structure of a single crystal formed by an epitaxial growth method on the Si-doped GaN buffer layer.

CITATION LIST

Patent Literature

PTL JP 2004-047764 A

SUMMARY

Technical Problem

According to PTL 1, as a result of doping of a substrate with Si at a high concentration, the growth mode of GaN changes from the normal two-dimensional growth mode to the three-dimensional island growth mode. Accordingly, when making the surface flat by growing the nitride semiconductor to bury the island structure of the Si-doped GaN layer, the direction of the propagation of dislocations propagating in the direction perpendicular to the substrate surface changes to the lateral direction in the process of the burying growth transverse direction; and as a result, the density of dislocations appearing on the outermost surface is substantially reduced. However, in recent years, III nitride semiconductors are required to have higher crystallinity. With a view to achieving higher crystallinity, there is a demand for a III nitride semiconductor epitaxial substrate having more excellent surface flatness and as III nitride semiconductor light-emitting device using the same, and methods of producing the same.

In recent years, as III nitride semiconductor epitaxial substrate is known, which is provided with a buffer layer made of AlN on a surface of a substrate. Such a III nitride semiconductor epitaxial substrate makes it possible to achieve higher crystallinity than that of a conventional one. However, as compared with Si doping on the GaN layer described in PTL 1, when a buffer layer made of AlN is doped with Si (hereinafter, a buffer layer made of an AlN composite doped with Si is referred to as "Si-doped AlN buffer layer"), even a low level of Si doping, would cause abrupt irregularities on the surface of the Si-doped AlN buffer layer. Therefore, Si doping has conventionally been avoided. However, according to the studies of the inventors of the present invention, an undoped AlN layer on as substrate, an Si-doped. AlN buffer layer having an Si concentration of $2.0 \times 10^{19}$/cm$^3$ or more and a thickness of 4 nm or more on the undoped AlN layer, and a superlattice laminate on the Si-sloped AlN buffer layer make it possible to obtain a III nitride semiconductor epitaxial substrate having excellent surface flatness. Based on this finding, they carried out further studies.

Si doping on an AlN buffer layer has conventionally been avoided; nevertheless, a high level Si doping on an AlN buffer layer, specifically an Si-doped AlN buffer layer having an Si concentration of $2.0 \times 10^{19}$/cm$^3$ or more and a thickness of 4 nm or more rather resulted in the improved surface flatness at the atomic level. However, further studies made by the inventors revealed that in some cases, when a III nitride semiconductor light emitting device formed by sequentially forming an n-type cladding layer, an active layer, and a p-type cladding layer (hereinafter, they will be collectively referred to as "device formation layer") on a III nitride semiconductor epitaxial substrate having excellent surface flatness, obtained as described above; although the III nitride semiconductor epitaxial substrate has high surface flatness, the shape of the EL (Electroluminescence) spectrum has double peaks. Here, the term "double peaks" refers to the phenomenon where strong emissions are observed not only at the theoretical emission wavelengths at which emission is supposed to occur in the active layer but also at longer wavelengths. When the shape of the EL spectrum had double peaks, the energy consumption at wavelengths other than the target wavelengths leads to the reduced internal quantum efficiency, and the wavelength components of other than the emission wavelengths required for a light emitting device are included. Such a device cannot be used as a normal light emitting device. Thus, when the shape of the spectrum has double peaks, such a device is not appropriate as a light emitting device. Yet further, the inventors studied to find that cracks would be formed in a III nitride semiconductor light emitting device depending on the relationship between the Si concentration and the thickness of the Si-doped AlN buffer layer. Here, since the formation of cracks can cause device breakdown, a III nitride semiconductor light emitting device having cracks is not appropriate as a light emitting device. Note that "cracks" mean cracks or fissures that do not cause division of a substrate.

In view of the above problems, it could therefore be helpful to mitigate the problems of crack formation and double peaks in the shape of the EL spectrum even in the case where a buffer layer made of AlN doped with Si is provided on a substrate and to provide a III nitride semiconductor epitaxial substrate having excellent surface flatness and a III nitride semiconductor light emitting device using the same, and the methods of producing the same.

Solution to Problem

The inventors diligently studied the conditions for doping an AlN layer on a substrate with Si and found that excellent surface flatness can be achieved and the cracks and double peaks described above can be suppressed by making the Si-doped AlN buffer layer have an Si concentration of $2.0 \times 10^{19}/cm^3$ or more and a thickness of 4 nm to 10 nm. Thus, they made the present invention. This disclosure is based on the above findings and we provide:

(1) A III nitride semiconductor epitaxial substrate comprising: a substrate of which at least a surface portion is made of AlN; an undoped AlN layer is formed on the substrate: an Si-doped AlN buffer layer formed on the undoped AlN layer; and a superlattice laminate formed on the Si-doped AlN buffer layer,
wherein the Si-doped AlN buffer layer has an Si conceit ration of $2.0 \times 10^{19}/cm^3$ or more and a thickness of 4 am to 10 nm.

(2) The III nitride semiconductor epitaxial substrate according to (1) above, wherein the superlattice laminate is formed by stacking a high Al-content layer ($Al_xGa_{1-x}N$, where the average composition x in the crystal growth direction satisfies $0.9 < x \leq 1$) on the Si-doped AlN buffer layer and alternately stacking n sets (where n is an integer satisfying, $4 \leq n \leq 10$) of low Al-content layers ($Al_yGa_{1-y}N$, where the average composition y in the crystal growth direction satisfies $0 < y < x$) and such high Al-content layers, and
the first to (n−2)th low Al-content layers from the Si-doped AlN buffer layer side have a first thickness, the (n−1)th low Al-content layer has a second thickness larger than the first thickness, and the nth low Al-content layer has a third thickness equal to or larger than the second thickness.

(3) The III nitride semiconductor epitaxial substrate according to (2) above, wherein the low Al-content layers are composition graded layers in which the Al composition decreases along the crystal growth direction.

(4) The III nitride semiconductor epitaxial substrate according to (2) or (3) above, wherein the high Al-content layers are AlN layers (x=1).

(5) The III nitride semiconductor epitaxial substrate according to any one of (2) to (4) above, wherein the third thickness is larger than the second thickness:

(6) The III nitride semiconductor epitaxial substrate according to any one of (2) to (5) above, wherein the high Al-content layers have the same thickness.

(7) A III nitride semiconductor light emitting device comprising: the III nitride semiconductor epitaxial substrate according to any one of (1) to (6) above; and an n-type cladding layer, an active layer, and a p-type cladding layer, in this order, on the substrate.

(8) A method of producing a III nitride semiconductor epitaxial substrate, comprising the steps of: forming an undoped AlN layer on a substrate of which at least a surface portion is made of AlN; forming an Si-doped AlN buffer layer on the undoped AlN layer, and forming a superlattice laminate on the Si-doped AlN buffer layer,
wherein in the step of forming the Si-doped AlN buffer layer, Si doping is performed such that an Si concentration of $2.0 \times 10^{19}/cm^3$ or more is achieved and a thickness of the Si-doped AlN buffer layer is 4 nm to 10 nm.

(9) A method of producing a III nitride semiconductor light emitting device comprising a step of sequentially forming an n-type cladding layer, an active layer, and a p-type cladding layer on the III nitride semiconductor epitaxial substrate according to (8) above:

Advantageous Effect

This disclosure provides a III nitride semiconductor epitaxial substrate having more excellent surface flatness, in which the problems of crack formation and the double peaks in the shape of the EL spectrum are mitigated by employing appropriate conditions for Si doping on an AlN layer on a substrate; a III nitride semiconductor light emitting device; and methods of producing the same.

BRIEF DESCRIPTION OF THE DRAWINGS

The patent or application file contains at least one drawing executed in color. Copies of this patent or patent application publication with color drawings will be provided by the Office upon request and payment of the necessary fee.

In the accompanying drawings;

FIG. 5 is a view illustrating an example of change in the mixing ratio of TMG (trimethylgallium) and TMA (trimethylammonium) over time in a method of producing a III nitride semiconductor epitaxial substrate 100;

FIG. 6 is a view illustrating an example of change in the mixing ratio of TMG and TMA over time in a method of producing a III nitride semiconductor epitaxial substrate 100;

DETAILED DESCRIPTION

Figure 1:
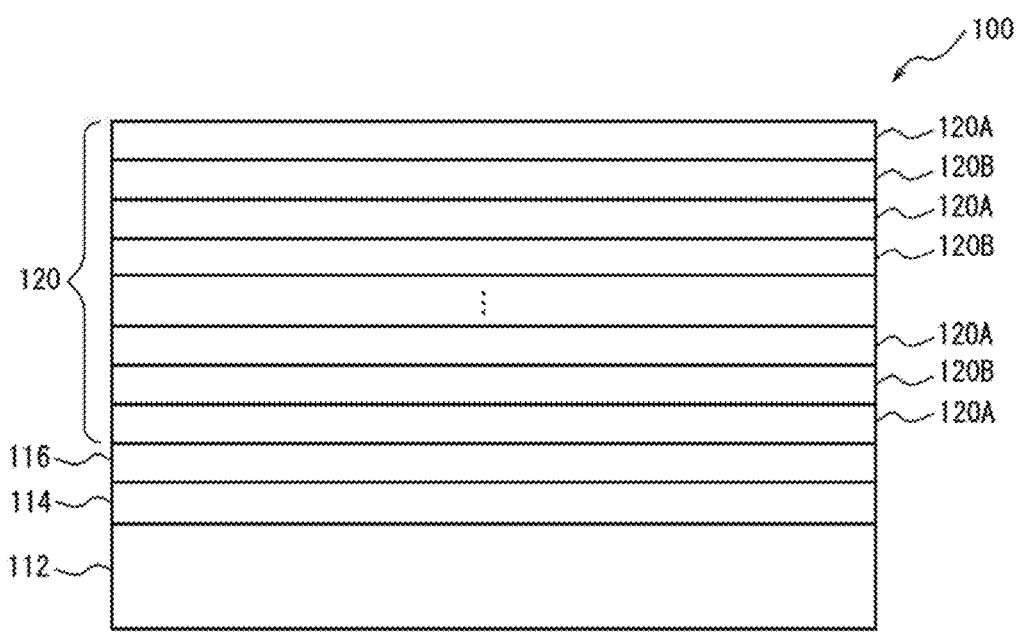
FIG. 1 is a schematic cross-sectional view of a III nitride semiconductor epitaxial substrate 100 according to one embodiment.

Embodiments of a in nitride semiconductor epitaxial substrate will be described below with reference to the drawings. Note that in FIG. 1, FIG. 2, FIG. 3, and FIG. 4, the thicknesses of the layers are exaggerated relative to the Si substrate for the sake of explanation and have a ratio different from the actuality different from the ratio of the thicknesses. Further, the layered structures of superlattice laminates 120, 220 are partly omitted in FIG. 1, FIG. 2, and FIG. 4. In principle, the same components are denoted by the same reference numerals, and the description will not be repeated.

Here, the term "AlGaN" alone herein means a compound having a chemical composition ratio of III elements (Al and Ga in total) with respect to N of 1:1 and any given ratio between the III elements of Al and Ga. The terra "AlGaN" does not exclude AlN or GaN. Further, when the ratio of the Al composition of the III elements in the compound does not change in the crystal growth direction, the ratio is specifically referred to as "Al content". Note that both a layer made of AlN and a surface portion in this disclosure are single crystal AlN layers, and are not polycrystal-based, or amorphous-based AlN layers, which are grown for example at a to temperature of 900° C. or less.

As shown in FIG. 1, a III nitride semiconductor epitaxial substrate 100 according to one of the disclosed embodiments has a substrate 112 of which at least a surface portion is made of AlN, an undoped AlN layer 114 formed on the substrate 112, an Si-doped AlN buffer layer 116 formed on the undoped AlN layer 114, and a superlattice laminate 120 formed on the Si-doped AlN buffer layer 116. Here, it is important that the Si-doped AlN buffer layer 116 has all Si concentration of $2.0 \times 10^{19}/cm^3$ or more and a thickness (also referred to as "film thickness") of 4 nm to 10 nm.

Examples of the substrate 112 of which at least a surface portion is made of AlN include AlN template substrates in which an AlN single crystal is formed on a substrate made of sapphire, SiC, Si, diamond, or as metal such as Al, and AlN single crystal substrates in which the whole substrate is made of AlN. The thickness of the substrate 112 is suitably determined taking into account the warpage after the epitaxial growth of the layers, and is for example within the range of 400 μm to 2000 μm.

Note that AlN of the surface portion of the substrate 112 used in this disclosure, has good crystallinity and is preferably, for example, a substrate showing a half width of 600 s or less in the X-ray rocking curve (XRC) analysis on the (102) plane of AlN. The dislocation density is preferably $1.0 \times 10^9/cm^2$ or less. When a substrate having less dislocations is used, crack formation due to excessive formation of dislocations can be suppressed in a case where the Si-doped AlN buffer layer 116 used as described below.

The undoped AlN layer 114 is formed on the substrate 112 of which at least a surface portion is made of AlN. The undoped AlN layer 114 is designed to take over the crystallinity of AlN of the substrate having, good crystallinity and the thickness thereof is within the range of 10 nm to 50 nm. Note that "undoped" here means not intentionally being doped with impurities and does not mean to exclude inevitable impurities from the device or due to dispersion or the like. Specifically, when undoped, the impurity concentration of impurities that can be p-type or n-type and are not inevitable impurities is defined to be $5.0 \times 10^{16}/cm^3$ or less. This level of concentration does not contribute to electrical conduction in light emitting devices such as LEDs.

On the undoped AlN layer 114, the Si-doped AlN buffer layer 116 having an AlN composition and an Si concentration of $2.0 \times 10^{19}/cm^3$ or more is formed. The Si concentration herein means a value of the peak detection intensity of impurities observed using a secondary ion-microprobe mass spectrometer (SIMS), which is converted into a concentration. The thickness of the Si-doped AlN buffer layer 116 is 4 nm to 10 nm. The reason that the Si-doped AlN buffer layer 116 is made to have an Si concentration of $2.0 \times 10^{19}/cm^3$ or more and a thickness of 4 nm to 10 nm is described below.

The superlattice laminate 120 is formed on the Si-doped AlN buffer layer 116. The superlattice laminate 120 is formed by alternately stacking a plurality first layers having a film thickness approximately equivalent to the de Broglie wavelength and a plurality of second layers having a different composition from the first layers and having a film thickness approximately equivalent to the de Broglie wavelength. The superlattice laminate 120 can suppress dislocations in the outermost surface of the III nitride semiconductor epitaxial substrate.

For example, a first Al-containing layer 120A is formed on the Si-doped AlN buffer layer 116, and on the first Al-containing layer 120A, a plurality of second Al-containing layers 120B and a plurality of first Al-containing layers 120A that have different Al compositions are stacked to form the superlattice laminate 120. On this occasion, the lowermost layer and the uppermost layer of the superlattice laminate 120 are first Al-containing layers 120A. Note that in this embodiment, since the superlattice laminate 120 is not required to be conductive, at least either the first Al-containing layers 120A or the second Al-containing layers 120B are undoped layers. For example, either ones of them may be undoped layers and the other ones of them may be a layer doped with impurities such as Mg. Alternatively, both the first Al-containing layers 120A and the second Al-containing layers 120B may be undoped. Without intending to limit the superlattice laminate 120 of this embodiment, for example, the first Al-containing layers 120A and the second Al-containing layers 120B can have AlGaN compositions with different average Al compositions. For example, the Al content of the first Al-containing layers 120A can be higher than the average Al composition of the second Al-containing layers 120B. Note that the superlattice laminate 120 is formed on the entire surface of the Si-doped AlN buffer layer 116.

In the characteristic structure of the III nitride semiconductor epitaxial substrate 100 according to one embodiment, the Si-doped AlN buffer layer 116 has an Si concentration of $2.0 \times 10^{19}/cm^3$ or more and a thickness of 4 nm to 10 nm. By employing such a structure, a III nitride semiconductor epitaxial substrate having more excellent surface flatness can be provided.

The technical meaning of employing such a structure will be described with the operation and effect, in order to obtain a III nitride semiconductor epitaxial substrate having excellent surface flatness, the inventors made various studies on the buffer layer on the substrate 112 of which at least a surface portion is made of AlN. Here, as mentioned previously, as compared with Si doping, on a GaN layer, Si doping, on an AlN layer has conventionally been avoided because such doping causes more abrupt irregularities on the surface of the AlN layer. However, according to the studies of the inventors, the III nitride semiconductor epitaxial substrate 100 having excellent surface flatness was found to be obtained by using the substrate 112, the undoped AlN layer 114, the Si-doped AlN layer 116, and the superlattice laminate 120. Accordingly, they made further studies. Specifically, they found that as III nitride semiconductor epitaxial substrate having excellent surface flatness can be obtained by forming a buffer layer made of AlN (corresponding to the undoped AlN layer 114; forming the Si-doped AlN buffer layer 116) on the ti substrate 112; Si-doping a superficial part of the buffer layer on the side closer to the superlattice laminate (corresponding to the Si-doped AlN buffer layer 116) at an Si concentration of $2.0 \times 10^{19}/cm^3$ or more with the thickness thereof being set to 4 nm or more, and further forming the superlattice laminate 120.

As described below in Examples, according to more detailed studies by the inventors, even if the Si-doped AlN buffer layer 116 had an Si concentration of less than $2.0 \times 10^{19}/cm^3$, the III nitride semiconductor epitaxial substrate can have excellent surface flatness. However, it was found that in the case where the III nitride semiconductor light emitting device obtained by forming a device formation layer on the epitaxial substrate is fabricated, an Si concentration of less than $2.0 \times 10^{19}/cm^3$, for example, $1.0 \times 10^{19}/cm^3$, is likely to result in double peaks in the shape of the EL spectrum. Therefore, the Si concentration of the Si-doped AlN buffer layer 116 is required to be $2.0 \times 10^{19}/cm^3$ or more.

On the other hand, it was also found that even if the Si concentration of the Si-doped AlN buffer layer 116 is $2.0 \times 10^{19}/cm^3$ or more, cracks would be formed due to heavy Si doping and the EL spectrum would have double peaks, depending on the thickness of the Si-doped AlN buffer layer 116. According to more detailed studies by the inventors, even if the Si-doped AlN buffer layer 116 has an Si concentration of $2.0 \times 10^{19}/cm^3$ or more, a thickness of more than 10 nm would be likely to result in excessive level of Si-doping on the Si-doped AlN buffer layer 116 as a whole and would cause the formation of cracks due to the tensile strain caused by excessive progress of the lattice relaxation. Further, a thickness of less than 4 nm would result in double peaks in the shape of the EL spectrum, since the Si-doped AlN buffer layer 116 as a whole is doped with deficient Si, all the defects formed in the Si-doped AlN buffer layer cannot completely be recombined and annihilated. Further, it was also found that when the Si-doped AlN buffer layer 116 has an Si concentration of $2.0 \times 10^{19}/cm^3$ or more, the strain-relaxing effect can be obtained between the substrate 112 and the device formation layer constituted by a III nitride layer to be grown on the Si-doped AlN buffer layer, thus reducing the warpage of the III nitride semiconductor epitaxial substrate.

As described above, the inventors found that when the Si-doped AlN buffer layer 116 between the undoped AlN layer 114 and the superlattice laminate 120 has an Si concentration of $2.0 \times 10^{19}/cm^3$ or more and a thickness of 4 nm to 10 nm, the aim of this disclosure can be fulfilled, and thus completed the present invention. Further, the disclosed III nitride semiconductor epitaxial substrate can suppress crack formation in the III nitride semiconductor light emitting device using the substrate and can provide a normal single-peak EL spectrum (having one peak).

The reason that the above effect can be obtained has not become theoretically clear; however, the inventors speculate as follows. Since Si doping on a buffer layer made of AlN causes irregularities on the buffer layer surface and roughens the surface, it has conventionally been avoided in obtaining a semiconductor epitaxial substrate. When a substrate having many dislocations is used, excessive dislocations are formed in the Si-doped AlN buffer layer, which would lead to the formation of cracks. This is conceivably another reason that Si doping has conventionally been avoided.

When a substrate having many dislocations is used, many dislocations propagate from the substrate. Accordingly, there are some cases where many plane defects are recombined, and annihilated, which therefore causes no warpage with large protrusions, resulting in a flat surface. On the other hand, when as substrate having a small number of dislocations is used, slight dislocations propagate from the substrate, and plane defects formed remain without being annihilated to form large protrusions. To address this problem, they found that excellent surface flatness can be achieved and the warpage is reduced by providing a layer having a rather high Si concentration of $2.0 \times 10^{19}/cm^3$ or more with an appropriate thickness is inserted, thereby annihilating plane defects before a large protrusion is formed.

Without being bound by theory, by the effect described above, the III nitride semiconductor epitaxial substrate 100 of this embodiment allows excellent surface flatness to be realized, and when a III nitride semiconductor light emitting device is fabricated using the III nitride semiconductor epitaxial substrate 100; conceivably, the formation of cracks can be suppressed and the EL spectrum can have the normal shape. Further, the warpage of the III nitride semiconductor epitaxial substrate can be reduced.

In the III nitride semiconductor epitaxial substrate 200 according to a preferred embodiment, the superlattice laminate 220 is preferably obtained by alternately stacking AlGaN layers having two Al compositions: high Al-content layers ($Al_xGa_{1-x}N$) having an average composition x in the crystal growth direction satisfying $0.9 < x \leq 1$ and low Al-content layers ($Al_yGa_{1-y}N$) having an average composition y satisfying $0 < y < x$ in the crystal growth direction on an AlN buffer layer 216. In this case, preferably, the first to the (n−2)th low Al-content layers from the AlN buffer layer side have a first thickness, and the (n−1)th low Al-content layer has a second thickness lager than the first thickness; and the nth low Al-content layer has a third thickness equal to or larger than the second thickness. With n being 10 or less, the lamination number of the superlattice laminate 220 can be reduced, thereby further reducing the warpage of the III nitride semiconductor epitaxial substrate 200.

Here, in the superlattice laminate 220, the laminate consisting of the layers from the high Al-content layer directly on the AlN buffer layer 216 to the (n−2)th high Al-content layer from the AlN buffer layer 216 side is referred to as "first laminate 221". The high Al-content layers in the first laminate 221 are expressed as high Al-content layers 221A and the low Al-content layers therein are expressed as low Al-content layers 221B. Further, the low Al-content layer directly on the first laminate 221 is expressed as a low Al-content layer 222B; the high Al-content layer on the low Al-content layer 222B is expressed as a high Al-content layer 222A; and the laminate consisting of the low Al-content layer 222B and the high Al-content layer 222A is referred to as "second laminate 222". Yet further, the low Al-content layer directly on the second laminate 222 is expressed as a low Al-content layer 223B; the high Al-content layer on the low Al-content layer 223B is expressed as a high Al-content layer 223A; and the laminate consisting of the low Al-content layer 223B and the high Al-content layer 223A is referred to as "third laminate 223". Accordingly, the low Al-content layer 222B is the (n−1)th low Al-content layer from the AlN buffer layer side and has the second thickness. The low Al-content layer 223B is the nth low Al-content layer from the AlN buffer layer side and has the third thickness.

Figure 2:
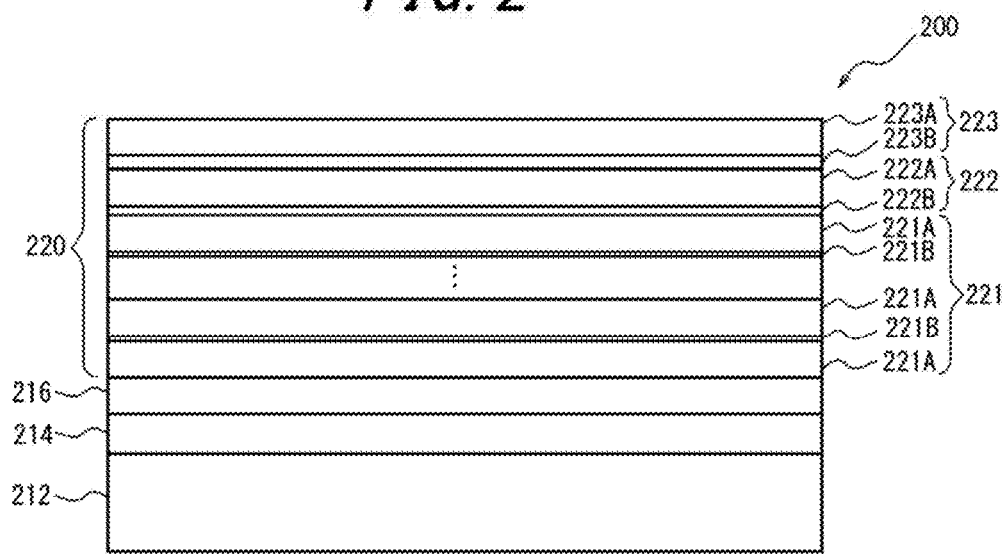
FIG. 2 is a schematic cross-sectional view of a III nitride semiconductor epitaxial substrate 200 according to a preferred embodiment.
Figure 3:
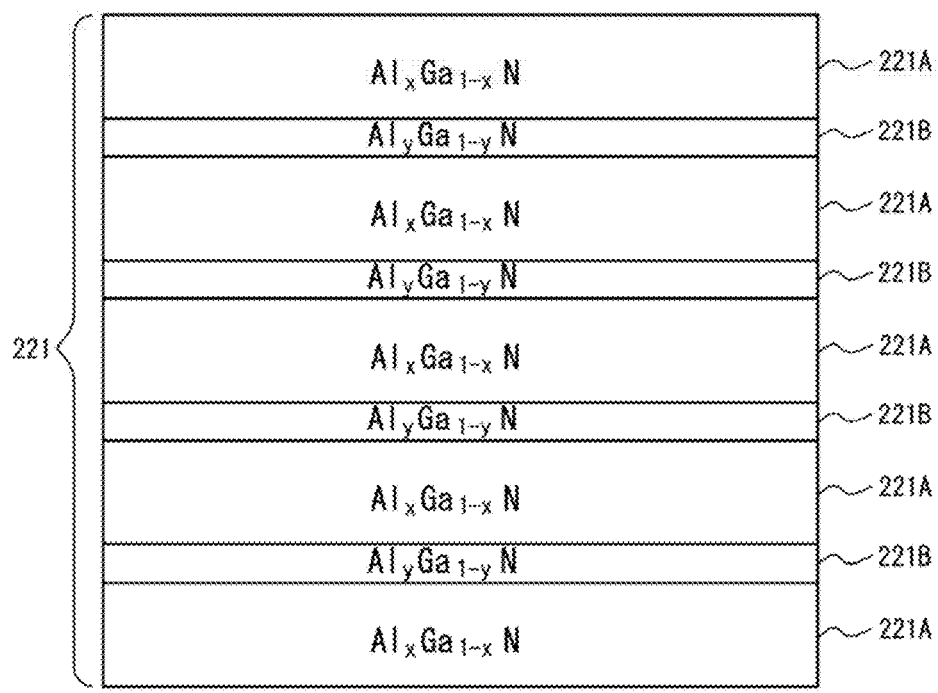
FIG. 3 is an enlarged view of a first laminate 221 of the III nitride semiconductor epitaxial substrate 200 in FIG. 2.

The details of the superlattice laminate 220 according to a preferred embodiment will now be described with reference to FIG. 2 and FIG. 3.

On the AlN buffer layer 216, the superlattice laminate 220 composed of the above-described first laminate 221, the second laminate 222, and the third laminate 223 is preferably formed. As previously described, the superlattice laminate 220 is preferably obtained by alternately stacking AlGaN layers having two types of average Al compositions, that is, high Al-content layers ($Al_xGa_{1-x}N$) having an average composition x in the crystal growth direction satisfying $0.9 < x \leq 1$ and low Al-content layers ($Al_yGa_{1-y}N$) having an average composition y in the crystal growth direction satisfying 0<y<x. Here, for the average composition x of the high Al-content layers, "$Al_xGa_{1-x}N$ (0.9<x≤1)" means that even when the Al composition of each high Al-content layer is constant, the Al compositions of the layers may continuously or discontinuously change, and the average Al composition x in the crystal growth direction satisfies 0.9<x≤1. The average Al composition y of the low Al-content layer being expressed as "$Al_yGa_{1-y}N$ y<x≤1)" is defined similarly. Further, the high Al-content layers 221A to 223A preferably have the same average Al composition x. Similarly, the low Al-content layers 221B to 223B preferably have the same average Al composition y.

Here, with respect to the lamination number of the superlattice laminate 220, the lamination number of the low Al-content layers and the high Al-content layers, except for the high Al-content layer on the AlN buffer layer 216, that are alternately and sequentially formed is expressed as n sets (note that n is an integer satisfying 4≤n≤10). Using n described above, the first laminate 221 is formed by stacking one high Al-content layer 221A on the AlN buffer layer 216 and alternately stacking (n−2) sets of the low Al-content layers 221B and the high Al-content layers 221A in this order thereon. The film thickness of the high Al-content layers 221A can be approximately 1 nm to 10 nm. The high, Al-content layers 221A in the first laminate 221 can each have a thickness of any value within the above range. Meanwhile, the film thickness of the low Al-content layers 221B, that is, the first thickness, can be approximately 0.5 nm to 1.5 nm, and the first thickness is preferably constant in the first laminate 221. The total film thickness of the first laminate 221 can be approximately 3 nm to 92 nm.

In the second laminate 222 on the first laminate 221, one layer of the to low Al-content layer 222B having the second thickness larger than the first thickness and one layer of the high Al-content layer 222A are preferably stacked in this order. The film thickness of the high Al-content layer 222A can be approximately 1 nm to 10 nm, and the film thickness may be equal to or different from the film thickness of the high Al-content layers 221A in the first laminate 221. Meanwhile, the film thickness of the low Al-content layer 222B (the second thickness) can be approximately 1.5 nm to 2.5 nm under the condition that the film thickness is larger than the first thickness of the low Al-content layers 221B in the first laminate 221. The total film thickness of the second laminate 222 can be approximately 2.5 nm to 12.5 nm.

On the second laminate 222, the third laminate 223 obtained by stacking one layer of the low Al-content layer 223B having the third thickness larger than the second thickness and one layer of the high Al-content layer 223A is formed. The film thickness of the high Al-content layer 223A can be approximately 1 nm to 10 nm, and the film thickness may be equal to or different from the film thickness of the high Al-content layers 221A in the first laminate 221 and/or the film thickness of the high Al-content layers 222A in the second laminate 222. Meanwhile, the film thickness of the to Al-content layer 223B (the third thickness) can be approximately 1.5 nm to 3.5 nm under the condition that the film thickness is equal to or larger than the film thickness of the low Al-content layer 222B (the second thickness) in the second laminate 222. In other words, different from the relationship between the first thickness and the second thickness, although the third thickness may be equal to the second thickness, the third thickness is preferably larger than the second thickness as described below.

Here, as previously described, the upper limit of the number n of sets in which the low Al-content layers and the high Al-content layers are alternately stacked is preferably 10 or less, and a reduced total thickness aligns the locations where defects are formed and joins defects together to annihilate them. Consequently, the planarization of the III nitride semiconductor epitaxial substrate 200 can be promoted. The number a of sets in which the layers are alternately stacked is preferably 5 or more and 7 or less (5≤n≤7), most preferably 6 (n=6). With a being 5 or more, the stress can be relaxed, and n being 7 or less can further reduce defects. Alternatively, with a being 6, those effects can be best achieved. Note that when the low Al-content layers and the high Al-content layers except for the underlying high Al-content layer 221A formed on the AlN buffer layer 216 are alternately stacked to form the superlattice laminate 220 having, for example, six sets to 6), the lamination set number of the superlattice laminate 220 is expressed as "6.5 sets". That is, using the number a described, above, the lamination set number of the superlattice laminate 220 can be expressed as (n+0.5) sets.

The reasons that the superlattice laminate 220 preferably has the first laminate 221, the second laminate 222, and the third laminate 223, and the number n of the sets in which the layers are alternately stacked is preferably within the numerical range described above will be described below.

The present inventors made various studies on the surface flatness of the case where the superlattice laminate 220 formed on the AlN buffer layer 216 is formed with a the lamination set number smaller than conventionally known lamination set numbers (for example, 40.5 sets) by a considerable number in order to further reduce the warpage of the III nitride semiconductor epitaxial substrate 200. When the AlN buffer layer 216 is doped with Si at an impurity concentration of less than $2.0 \times 10^{19}/cm^3$, the lamination set number of the superlattice laminate 220 is 4.5 sets, and the second and third laminates are not formed: irregularities with random heights are formed on the surface of an n-type contact layer formed on the superlattice laminate 220. In contrast, when the second and third laminates are additionally provided without changing the impurity concentration of Si doping and the lamination set number of the superlattice laminate 220 is 6.5 sets, although irregularities are formed on the surface of the n-type contact liter formed on the superlattice laminate 220, the raised surfaces have the same height. This is attributed to that since the second and third laminates are additionally provided, nucleation occurred only on the same plane. Further, when the Si-doped AlN buffer layer has an Si concentration of $2.0 \times 10^{19}/cm^3$ or more, the lamination set number of the first laminate is 4.5 sets, the second and third laminates are provided in the superlattice laminate 220, i.e. the lamination set number of the superlattice laminate 220 is 6.5 sets, no irregularities were observed on the surface of the n-type contact layer formed on the superlattice laminate 220 and the height of was uniform across the uppermost surface. The inventors attribute this to the possibility that a high Si doping level increases the source of plane defects to saturation, and when plane defects having the source on the same plane extend in the growth direction, almost all the adjacent plane defects are recombined together and annihilated.

Here, as previously described, since Si doping on a buffer layer made of AlN causes irregularities on the buffer layer surface and roughens the surface, it has conventionally been avoided in obtaining a semiconductor epitaxial substrate having excellent surface flatness. However, the inventors focused on the fact that with the provision of the second and third laminates, only an irregular surface having the uniform height is formed on the uppermost surface of the superlattice laminate 220 as described above. The inventors found that by doping the AlN buffer layer 216 with a large amount of Si on purpose, the raised surfaces having a uniform height is increased and saturated, thereby improving the flatness of the uppermost surface of the superlattice laminate 220 even in such cases where the lamination set number is 10.5 sets or less. Further, when the AlN buffer layer 216 is doped with a large amount of Si, while the flatness is improved, conceivably many defects are introduced and the stress is reduced, resulting in the reduced warpage. Thus, the flatness of the uppermost surface of the superlattice laminate 220 becomes high. The inventors ascribed this to the possibility that whereas when only the first laminate is formed as the superlattice laminate 220, dislocations randomly remain; when the second laminate and the third laminate are formed in which the low Al-content layers have a different thickness from those in the first laminate, only dislocations in a certain direction remain, resulting in the formation of plane defects and the relaxed strain.

As described above, with the provision of the superlattice laminate 220 having the low Al-content layers 221B to 223B having the first, second, and third thicknesses, respectively, a III nitride semiconductor epitaxial substrate and a III nitride semiconductor light emitting device in which more excellent surface flatness and further reduced warpage are realized can be obtained, which is preferable.

Note that according to the studies by the inventors, when n is 10 or less, the superlattice laminate 220 preferably include both the second laminate 227 and the third laminate 223. This is conceivably because when the lamination set number is considerably smaller than conventionally known lamination set numbers (for example, 40.5 sets) (that is, when it is 10 or less), only dislocations in a certain direction are likely to be formed by providing two or more loss Al-content layers having larger thickness than the first thickness of the low Al-content layer 221B.

Here, in the above preferred embodiment, the third thickness of the low Al-content layer 223B is preferably larger than the second thickness of the low Al-content layer 222B. When the directions of the dislocations are changed by generating a stress different from that on the second laminate, the dislocation annihilation effect is further expected, and the III nitride semiconductor epitaxial substrate 100 having more excellent surface flatness can be obtained.

Further, when the high Al-content layers 221A to 223A have the same thickness, a greater stress relaxation effect can be obtained, which is preferable.

The low Al-content layers 221B to 223B made of having an average composition of 0<y<x in the crystal growth direction are preferably composition graded layers in which the Al composition is reduced along the crystal growth direction. Of the composition graded layers, as layer in which the Al composition is constant in the crystal growth direction is referred to as "constant composition layer". The disclosed effects can be obtained irrespective of whether each of the low Al-content layers 221B to 223B is a composition graded layer or a constant composition layer. However, for the following reasons, the low Al-content layers 221B to 223B are preferably composition graded layers.

As previously described, a composition graded layer is a layer in which the composition of Al in AlGaN is graded such that the composition decreases continuously or discontinuously in the crystal growth direction. When the Al composition of the composition graded layers is graded so as to decrease in the crystal growth direction the Al composition is relatively high on the substrate 212 side of the composition graded layers. Accordingly, the coefficient of thermal expansion of the low Al-content layers approaches to the expansion coefficient of the substrate. On the other hand, on the crystal growth side of the composition graded layers, the Al composition is relatively low. Accordingly, when a device formation layer is formed on a III nitride semiconductor epitaxial substrate 210, the coefficient of thermal expansion of the low Al-content layers approaches to that of the device formation layer. Thus, warpage can be reduced and crack formation can be suppressed.

For the composition of the composition graded layer, when the composition value of Al in AlGaN is y1 on the side closer to the substrate 212 of which at least a surface portion is made of AlN, and is y2 on the crystal growth side, where the range of preferably $0.7 \leq y1 \leq x$, more preferably $0.9 \leq y1 \leq x$ is satisfied on the side closer to the substrate 212 and the range of preferably $0 \leq y2 < 0.3$, more preferably $0 \leq y2 < 0.1$ is satisfied on the crystal growth side. When the composition is graded from y1 to y2 within the above range of the value of y, the difference between the lattice constants between the substrate and the composition graded layers is reduced, which makes it possible to improve the crystallinity in the case of forming the device formation layer.

Note that the composition of Al in $Al_yGa_{1-y}N$ of the composition graded layers may either be continuous or discontinuous as long as it decreases in the crystal growth direction. Further, the rate at which the Al composition decreases may either be constant or irregular. Note that when the composition is continuously changed from y1 to y2, the average composition can be expressed as $y=(y1+y2)/2$.

Although the high Al-content layers may either be composition graded layers or constant composition layers, constant composition layers are preferred in which the Al composition is constant in the crystal growth direction. Further, all the high Al-content layers 221A to 223A are preferably AlN layers (accordingly, x=1). Thus, the difference of the average Al composition between each of the respective high Al-content layers and the adjacent low Al-content layer is maximized, and the strain buffering effect is maximized.

As previously described, the disclosed effects can be achieved as long as the Si concentration of the Si-doped AlN buffer layers 114, 214 is $2.0 \times 10^{19}/cm^3$ or more. However, the impurity concentration is preferably less than $8 \times 10^{19}/cm^3$. With the impurity concentration being $8 \times 10^{19}/cm^3$ or more, dislocations are excessively formed due to the AlN buffer layer, so that cracks would be formed.

Figure 4:
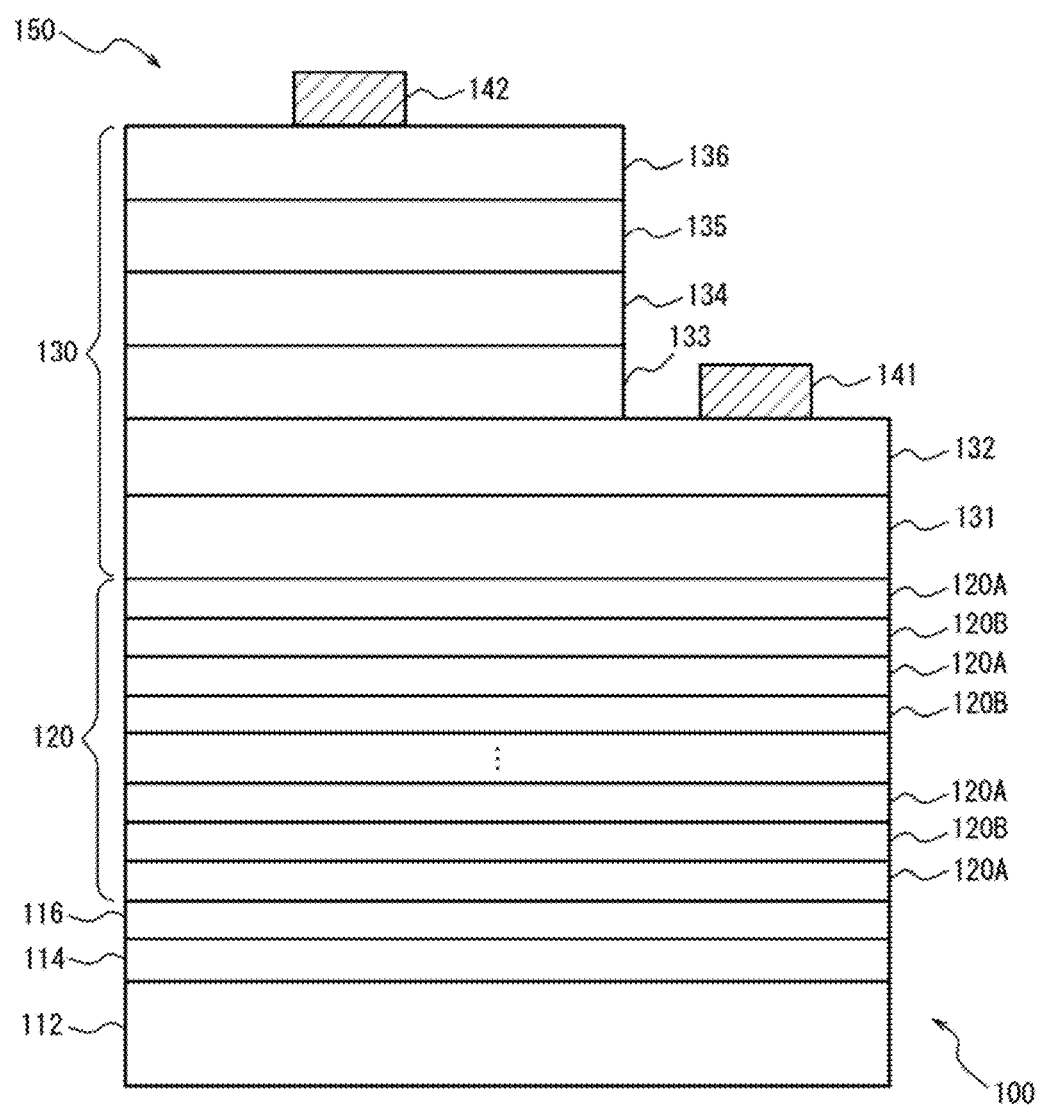
FIG. 4 shows an example of a III nitride semiconductor light emitting device 150 formed by providing a device formation layer 130 on a III nitride semiconductor epitaxial substrate 100 according to one embodiment.

The III nitride semiconductor epitaxial substrate 100 according to one embodiment can be used for example in a given semiconductor device such as a light emitting device a laser diode, or a transistor. FIG. 4 shows the III nitride semiconductor light emitting device 150 formed using the disclosed III nitride semiconductor epitaxial substrate 100.

The III nitride semiconductor light emitting device 150 characteristically has an n-type cladding layer 133, an active layer 134, and a p-type cladding layer 135 in this order on the III nitride semiconductor epitaxial substrate 100.

For example, on the superlattice laminate 120, a device formation layer 130 is formed in which a connection layer 131, an n-type contact layer 132, an n-type cladding layer 133, a multiple quantum well layer (MQW layer) 134 as an active layer, a p-type cladding layer 135, and a p-type contact layer 136 are sequentially formed by epitaxial growth using a known method such as MOCVD. After the formation of the device formation layer 130, the n-type contact layer 132 is partly exposed for example by dry etching, and an n-side electrode 141 and a p-side electrode 142 are located on the exposed part of the n-type contact layer 132 and the p-type contact layer 136, respectively, thereby forming the nitride light emitting device 150 having a lateral structure.

Since the III nitride semiconductor light emitting device 150 has excellent surface flatness; high crystallinity can be achieved, crack formation can be suppressed, and a normal EL spectrum can be obtained in the III nitride semiconductor light emitting device 150.

Note that "AlGaN" forming the high Al-content layers and the low Al-content layers in this specification may contain 1 or less in total of B and/or In which are other III elements. Further, "AlGaN" may contain a slight amount of impurities such as for example Si, H, O, C, Mg, As, or P. Furthermore, "AlGaN" may be partly doped with Mg impurities. Note that AlN and the like that form the III nitride laminate may also contain other III elements up to a total amount of 1%.

Further, the terms such as "constant, "equal", "uniform", and "the same" herein do not specifically refer to the mathematical equality, and naturally involve errors that are acceptable as long as the disclosed operation and effect are achieved, including errors that cannot be avoided in the production process. This also applies to the other embodiments. The terms "constant", "equal", "uniform", "the same" accept such errors within 3%.

(Method of Producing III Nitride Semiconductor Epitaxial Substrate)

The method of producing the disclosed III nitride semiconductor epitaxial substrate 100 includes the steps of forming the undoped AlN layer 114 on the substrate 112 of which at least a surface portion is made of AlN; forming the AlN buffer layer 116 on the undoped AlN layer 114; and forming the superlattice laminate 120 on the AlN buffer layer 116. Here, in the step of forming the AlN buffer layer 116, Si doping is performed to achieve an Si concentration of $2.0 \times 10^{19}/cm^3$ or more, and the AlN buffer layer 116 has a thickness of 4 nm to 10 nm.

Further, the method of producing the III nitride semiconductor light emitting device 150 has a step of forming, the n-type cladding layer 133, the active layer 134, and the p-type cladding layer 135 in this order on the III nitride semiconductor epitaxial substrate 100.

Alternatively, the previously described superlattice laminate 220 may be formed instead of the superlattice laminate 120. In the step of forming the superlattice laminate 220, a high Al-content layer ($Al_xGa_{1-x}N$, where the average composition x in the crystal growth direction satisfies $0.9 < x \le 1$) is stacked on the Si-doped AlN buffer layer and a sets (where n is an integer satisfying $4 \le n \le 10$) of low Al-content layers ($Al_yGa_{1-y}N$, where the average composition y in the crystal growth direction satisfies $0 < y < x$) and such high Al-content layers are alternately stacked. Preferably, the thickness of the first to (n−2)th low Al-content layers from the Si-doped AlN buffer layer 216 side is a first thickness, the thickness of the (n−1)th low Al-content layer is a second thickness equal to or larger than the first thickness, and the thickness of the nth low Al-content layer is a third thickness larger than the second thickness.

Known methods such as MOCVD or MBE can be used for epitaxially growing the layers. Examples of a source gas used in the case of forming AlGaN include TMA (trimethylaluminum), TMG (trimethylgallium), and ammonia. The Al composition of each layer can be adjusted in accordance with the growth phase of the layer by controlling the mixing ratio of TMA and TMG.

Specifically, when constant composition layers in which the Al composition is constant are used in the layers, the Al composition can be controlled by changing the mixing ratio between TMA and TMG over time in accordance with the growth phase of the layers as shown in FIG. 5. Further, the thickness of the layers can be controlled as desired, by controlling the epitaxial growth time.

When composition graded layers are formed, the mixing ratio between TMG and TMA can be changed in accordance with the epitaxial growth time of the layers, thereby forming composition graded layers. With reference to FIG. 6, an embodiment in which the Al composition of the low Al-content layers is continuously reduced from 1 to 0.02 in the crystal growth direction will be described.

First, an AlN layer (high Al-content layer) is formed using TMA at a ratio of 100% without flowing TMG gas. After that, the flow of TMG is started without changing the gas flow rate of TMA such that the TMG gas flow rate is continuously increased from 0 sccm to the TMG flow rate at which the Al composition is theoretically 0.02 (i.e., Ga composition is 0.95) during a certain time period. Thus, a AlGaN composition graded layer (low Al-content layer), in which the Al composition is continuously reduced from 1 to 0.02 in the crystal growth direction is formed (the average Al composition is 0.51). Here, "the TMG flow rate at which the Al composition is theoretically 0.02" refers to a flow rate at which a predetermined Al composition is experimentally and previously confirmed to be achieved by flowing TMA and TMG at predetermined flow rates under the crystal growth conditions required for the apparatus to be used. In the experiment, the flow rates of TMA and TMG may be determined using a layer having a thickness sufficient to enable quantitative analysis of the Al composition by SIMS. Note that in the formation of the composition graded layer, the TMA gas flow rate is not necessarily constant, and can be changed in accordance with the target Al composition. Those layers are repeated to form, as the first laminate 221, a laminate in which the high Al-content layers and the low Al-content layers (five AlN layers and four AlGaN composition graded layers) are alternately stacked. Here, the low Al-content layers have the same thickness (first thickness) when the epitaxial growth time of each layer is the same. Next, an AlGaN composition graded layer and an AlN layer are formed as the second laminate 222. The AlGaN composition graded layer (low Al-content layer) having a larger thickness than one in the first laminate is formed by reducing the Al composition to 0.02 while reducing the rate of increase in the TMG flow rate per hour compared with the case of the first laminate and correspondingly decreasing the rate of decrease in the TMA flow rate per hour. After that, the AlN layer (high Al-content layer) is formed at a TMG flow rate of 0. For example, in the formation of the second laminate 222, when the epitaxial growth time during which the TMG flow rate is increased is twice that of the case of the first laminate, the film thickness of the low Al-content layer 222B in the second laminate 222 (second thickness) is twice the film thickness the low Al-content layers 221B in the first laminate 221 (first thickness). Further, as the third laminate 223, an AlGaN composition graded layer (low Al-content layer) having a larger thickness than one in the second laminate is formed by reducing, the Al composition to 0.02 while further reducing the rate of increase in the TMG flow rate per hour compared with the case of the second laminate, and correspondingly decreasing the rate of decrease in the TMA flow rate per hour. After that, the AlN layer (high Al-content layer) is formed at a TMG flow rate of 0. For example, when the epitaxial growth time during which the TMG flow rate in the third laminate 223 is increased is three times that of the case of the first laminate 221, the film thickness of the low Al-content layer 223B in the third laminate 223 (third thickness) is three times the film thickness the low Al-content layers 221B in the first laminate 221 (first thickness). Note that for the formation of the constant composition layer and composition graded layer, described with reference to FIG. 5 and FIG. 6, the V/III ratio of ammonia with respect to TMA and TMG can be determined as appropriate.

Note that for the evaluation of the Al composition and the film thickness after the epitaxial growth, a known method using optical reflectance, TEM-EDS, photoluminescence, or the like can be used. Note that for the film thickness of several nm to several tens urn of the superlattice structures, values of the film thickness are defined by TEM measurements. Note that EAG (Evans Analytical Group) was commissioned to carry out the TEM and the SIMS analysis.

The III nitride semiconductor epitaxial substrate and the III nitride semiconductor light emitting device, and methods of producing the same of this disclosure will be described in more detail below using examples. However, this disclosure is not limited to the following examples.

EXAMPLES

Test Example 1

An AlN template substrate was prepared m which an undoped AlN layer (thickness: 600 nm, half width of AlN (102) plane in the X-ray rocking curve (XRC): 242 s) was formed on a sapphire substrate (thickness: 430 µm). On the AlN template substrate, TMA: 11.5 sccm and $NH_3$: 575 sccm were flown at a pressure of 10 kPa and a temperature of 1150° C. by MOCVD to form an undoped AlN layer having a thickness of 21.6 nm. Subsequently. TMA: 11.5 sccm, $NH_3$: 575 sccm, and $SiH_4$: 50 sccm were flown to form an Si-doped AlN buffer layer having a thickness of 5.4 nm, doped with Si at an impurity concentration of $2.0 \times 10^{19}/cm^3$. Thus, the undoped AlN layer and the Si-doped AlN buffer layer were formed on the AlN template substrate. Specifically, the total layer thickness of the undoped AlN layer and the Si-doped AlN buffer layer on the AlN template substrate was 27 nm. The part of the layer doped with Si had a thickness of 5.4 nm. Next, as first laminate, a second laminate, and a third laminate composing a superlattice lattice laminate were sequentially epitaxially grown on the Si-doped AlN buffer layer, For the first laminate, an AlN layer (average composition x=1) having a film thickness of 8 nm with a constant composition was used as a high Al-content layer ($Al_xGa_{1-x}N$). For the formation of the high Al-content layer ($Al_xGa_{1-x}N$). TMA: 11.5 sccm and $NH_3$: 575 sccm were flown for 300 s. As a low Al-content layer ($Al_yGa_{1-y}N$), a composition graded layer having a film thickness of 1 nm with an average composition y=0.51 was used. For the formation of the low Al-content layer ($Al_yGa_{1-y}N$), while TMA: 11.5 sccm and $NH_3$: 575 sccm were flown, the flow rate of TMG was increased from 0 sccm to 45 sccm at a constant rate during an epitaxial growth time of 10 s. In the low Al-content layer, the Al composition is believed to continuously reduce from 1 to 0.02 along the crystal growth direction in theory. In the first laminate, the high Al-content layer was first formed on the AlN buffer layer, and four such low Al-content layers and four such high Al-content layers were then alternately stacked. The initially formed high Al-content layer is counted as 0.5 sets in the total 4.5 sets. In the formation of the second laminate subsequent to the formation of the first laminate, a low Al-content layer (a composition graded layer having a film thickness of 2 nm with an average composition y=0.51) and a high Al-content layer (film thickness: 8 nm, average composition x=1) were sequentially stacked in the same manner as the first laminate except that the flow rate of TMG was increased from 0 sccm to 45 sccm at a constant rate during an epitaxial growth time of 20 s. Further, as the third laminate on the second laminate, a low Al-content layer (a composition graded layer having a film thickness of 3 nm with an average composition y=0.51) and a high Al-content layer (film thickness: 8 nm, average composition x=1) were sequentially stacked in the same manner as the first laminate except that the flow rate of TMG was increased from 0 sccm to 45 sccm at a constant rate during an epitaxial growth time of 30 s. Accordingly, in this test example, the first laminate had 4.5 sets, the second laminate had 1 set, and the third laminate had 1 set, so that the lamination set number of the superlattice laminate was 6.5 sets in total, i.e., n=6.

After that, an undoped AlGaN layer (Al content: 0.7, thickness: 2400 nm) as a connection layer and an n-type AlGaN layer (Al content: 0.6, thickness: 1200 nm) as an n-type contact layer were sequentially epitaxially grown on the superlattice laminate, thus preparing a III nitride semiconductor substrate of Example 1.

Further, an n-type AlGaN layer as an n-type cladding layer (Al content: 61%, film thickness: 1200 nm, dopant: Si), an active layer (an AlGaN-based MQW layer; film thickness: 74 nm, Al content of well layer: 41%), a p-type AlGaN layer as a p-type cladding layer (Al content: 75%, film thickness: 20 nm, dopant: Mg), and a p-type GaN contact layer (film thickness: 35 nm, dopant: Mg) were sequentially epitaxially grown on the III nitride semiconductor epitaxial substrate, thus preparing a III nitride semiconductor light-emitting device having a flip-chip structure using the III nitride semiconductor epitaxial substrate of Test Example 1. Thus, a III nitride semiconductor light emitting device of Example 1 was fabricated. Note that in the fabrication of this III nitride semiconductor light emitting device, the n-type contact layer was partly exposed by dry etching, and an n-side electrode and a p-side electrode were disposed on the exposed part of the n-type contact layer and a p-type contact layer, respectively.

As the growth method of the above layers. MOCVD was used using TMA (trimethylaluminum), TMG (trimethylgallium), and ammonia as source materials. Nitrogen and hydrogen were used for the carrier gas. Further, $SiH_4$ (monosilane) was used for Si doping. The growth conditions for the layers were pressure: 10 kPa and temperature: 1150° C. The supply ratio between TMA and TMG was controlled as previously described with reference to FIG. 5 and FIG. 6, thereby controlling the Al composition ratio of the layers.

In Test Examples 2 to 7 below, the total layer thickness of the undoped AlN layer and the Si-doped AlN buffer layer on the AlN template substrate was 27 nm, and tests were performed in which the thickness and the Si concentration of the AlN layer doped with Si were changed with the total layer thickness being constant.

Test Example 2

A III nitride semiconductor epitaxial substrate and a III nitride semiconductor light emitting device according to Example 2 were fabricated in the same manner as the method in Text Example 1, except that the Si concentration of the Si-doped AlN buffer layer was changed to $4.0 \times 10^{19}$/cm$^3$.

Test Example 3

A III nitride semiconductor epitaxial substrate and a III nitride semiconductor light emitting device according to Comparative Example 1 were fabricated in the same manner as the method in Text Example 1, except that the Si concentration of the Si-doped AlN buffer layer was changed to $1.2 \times 10^{19}$/cm$^3$.

Test Example 4

A III nitride semiconductor epitaxial substrate and a III nitride semiconductor light emitting device according to Example 3 were fabricated in the same manner as Text Example 2, except that the film thickness of the undoped AlN layer was 18.9 nm and the film thickness of the Si-doped AlN buffer layer was 8.1 nm.

Test Example 5

A III nitride semiconductor epitaxial substrate and a III nitride semiconductor light emitting device according to Comparative Example 2 were fabricated in the same manner as Text Example 2, except that the film thickness of the undoped AlN layer was 14.3 nm and the film thickness of the Si-doped AlN buffer layer was 2.7 nm.

Test Example 6

A III nitride semiconductor epitaxial substrate according to Comparative Example 3 was fabricated by the same method as Test Example 1, except that the undoped AlN layer was not formed and the film thickness of the Si-doped AlN buffer layer was 2.7 nm.

Test Example 7

A III nitride semiconductor epitaxial substrate and a III nitride semiconductor light emitting device according to Comparative Example 4 were fabricated by the same method as Test Example 3, except that the undoped AlN layer was not formed and the film thickness of the Si-doped AlN buffer layer was 27 nm.

The substrate formation conditions for the III nitride semiconductor epitaxial substrates of Test Examples 1 to 7 above are shown in Table 1.

(Evaluation 1: Surface Flatness)

For the III nitride semiconductor epitaxial substrates of the test examples, the surface image of each n-type contact layer surface was obtained using a metallurgical microscope system (manufactured by Nikon), thereby determining the presence or absence of surface irregularities. The absence of surface irregularities means that the surface flatness of the III nitride semiconductor epitaxial substrate was excellent. The results are shown in Table 1, Note that in Table 1, samples having the surface irregularities were evaluated as "−", and samples without surface irregularities were evaluated as "+".

(Evaluation 2: Measurement of Substrate Warpage)

Figure 7:
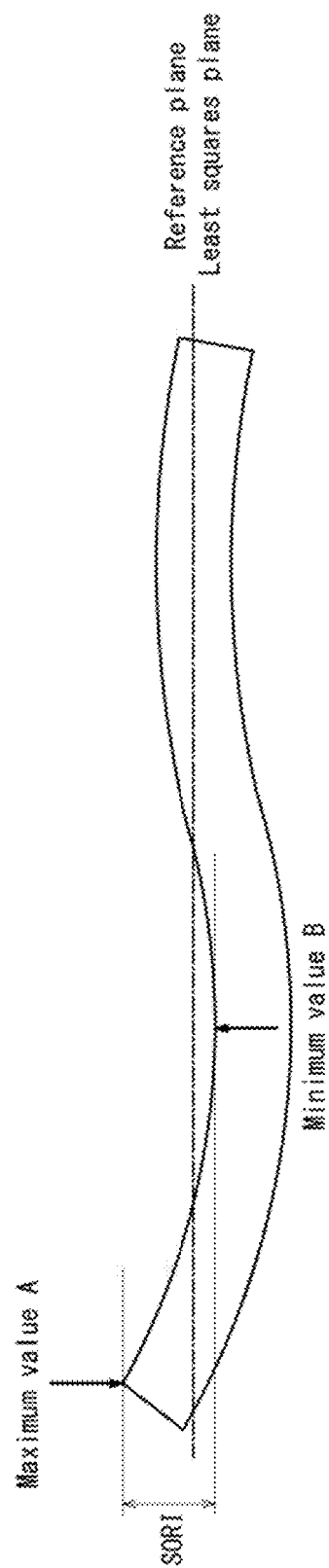
FIG. 7 is a schematic cross-sectional view of a substrate, illustrating the definition of warpage (SORI)

For the III nitride semiconductor epitaxial substrates of the test examples, the warpage of each III nitride epitaxial substrate after the formation of intermediate layers and the n-type contact layer on the superlattice laminate was measured in accordance with the SEMI Standard using a warpage measurement system using optical interferometry (FT-900 manufactured by NIDEK CO., LTD.). The results are shown in Table 1. The "warpage" herein is a warpage measured in accordance with SEMI M1-0302. Specifically, the warpage was measured in an unforced state, and the warpage is the value of the difference between the maximum and minimum values of the data of all the points of measurement for the wafer in an unchucked state. As shown in FIG. 7, provided that the reference plane is an imaginary plane found by the least squares method, the warpage (SORI) is represented by the sum of the absolute values of the maximum value A and the minimum value B. Note that the warpage is approximately 140 μm in a conventionally known III nitride semiconductor epitaxial substrate. In this regard, the test examples showing a warpage of less than 100 μm were evaluated as "+", and the test examples showing a warpage of 100 μm or more were evaluated as "−".

(Evaluation 3: Cracks)

For the III nitride semiconductor light, emitting devices of the test examples, the surface image of each device surface was obtained using a metallurgical microscope (manufactured by Nikon), thereby determining the presence or absence of cracks as well as the presence or absence of surface irregularities. The results are shown in Table 1. Note that the crack formation was evaluated in Table 1 as follows.

++: Cracks are not observed in the surface image.

+: Some cracks are observed in the surface image, yet they are practically acceptable.

−: Cracks are clearly formed and are not acceptable.

Here, the cracks within 5 mm from the periphery of the substrate and the cracks more than 5 mm distant from the

TABLE 1

| Test Example No. | Classification | Substrate formation conditions Si-doped AlN buffer layer | | Evaluation results | | | | |
|---|---|---|---|---|---|---|---|---|
| | | Si impurity concentration (/cm$^3$) | Thickness (nm) | Evaluation of irregularities on surface | Warpage | | Evaluation of cracks | EL spectrum shape |
| | | | | | Warpage (μm) | Evaluation of warpage | | |
| 1 | Example 1 | 2.00E+19 | 5.4 | + | 66 | + | ++ | single |
| 2 | Example 2 | 4.00E+19 | 5.4 | + | 79 | + | ++ | single |
| 3 | Comparative Example 1 | 1.20E+19 | 5.4 | + | 98 | + | ++ | double |
| 4 | Example 3 | 4.00E+19 | 8.1 | + | 85 | + | + | single |
| 5 | Comparative Example 2 | 4.00E+19 | 2.7 | − | 124 | − | ++ | double |
| 6 | Comparative Example 3 | 2.00E+19 | 27 | + | 33 | + | − | single |
| 7 | Comparative Example 4 | 1.20E+19 | 27 | + | 72 | + | + | double | periphery of the substrate that contain five or less straight lines are defined as practically acceptable cracks.

Figure 8:
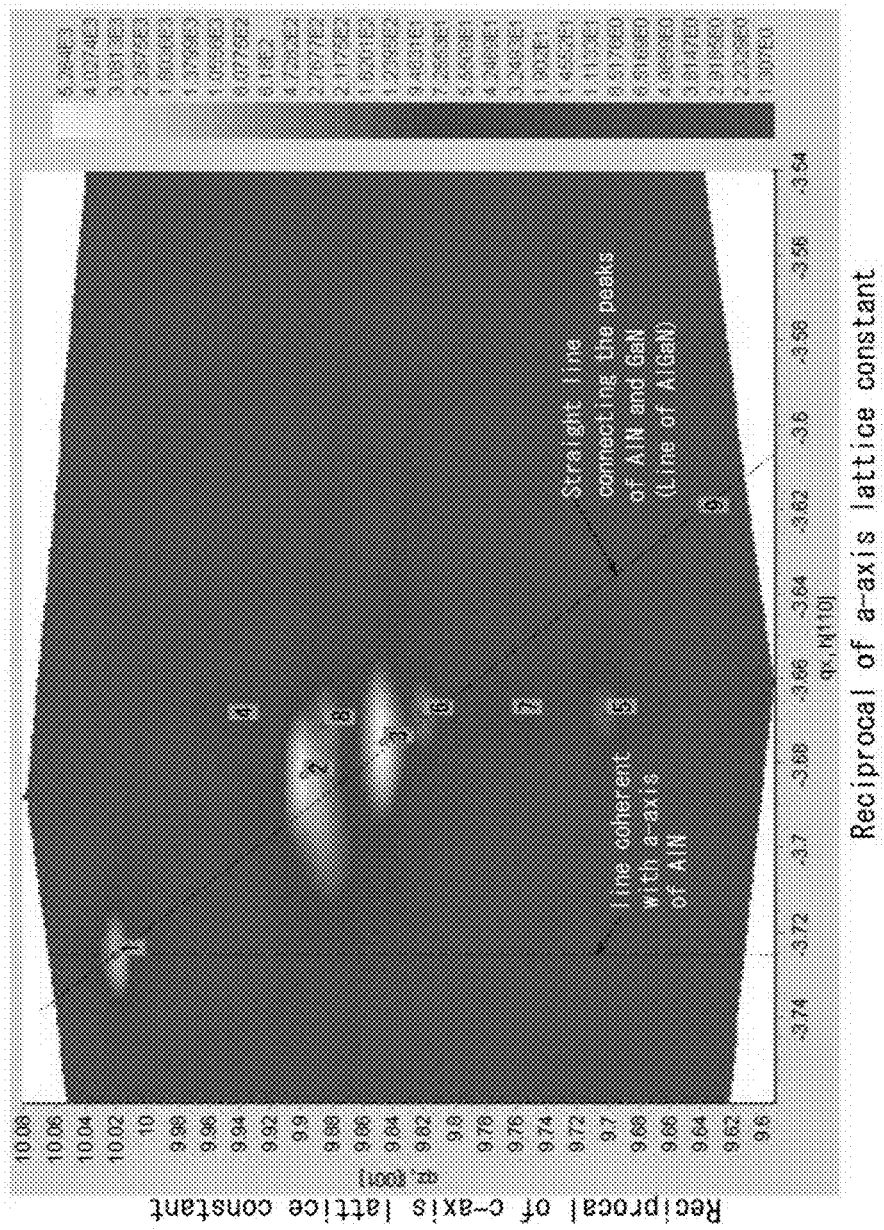
FIG. 8 is a view showing a reciprocal lattice space mapping of a III nitride semiconductor light emitting device according to Example 1 (Test Example 1)
Figure 9:
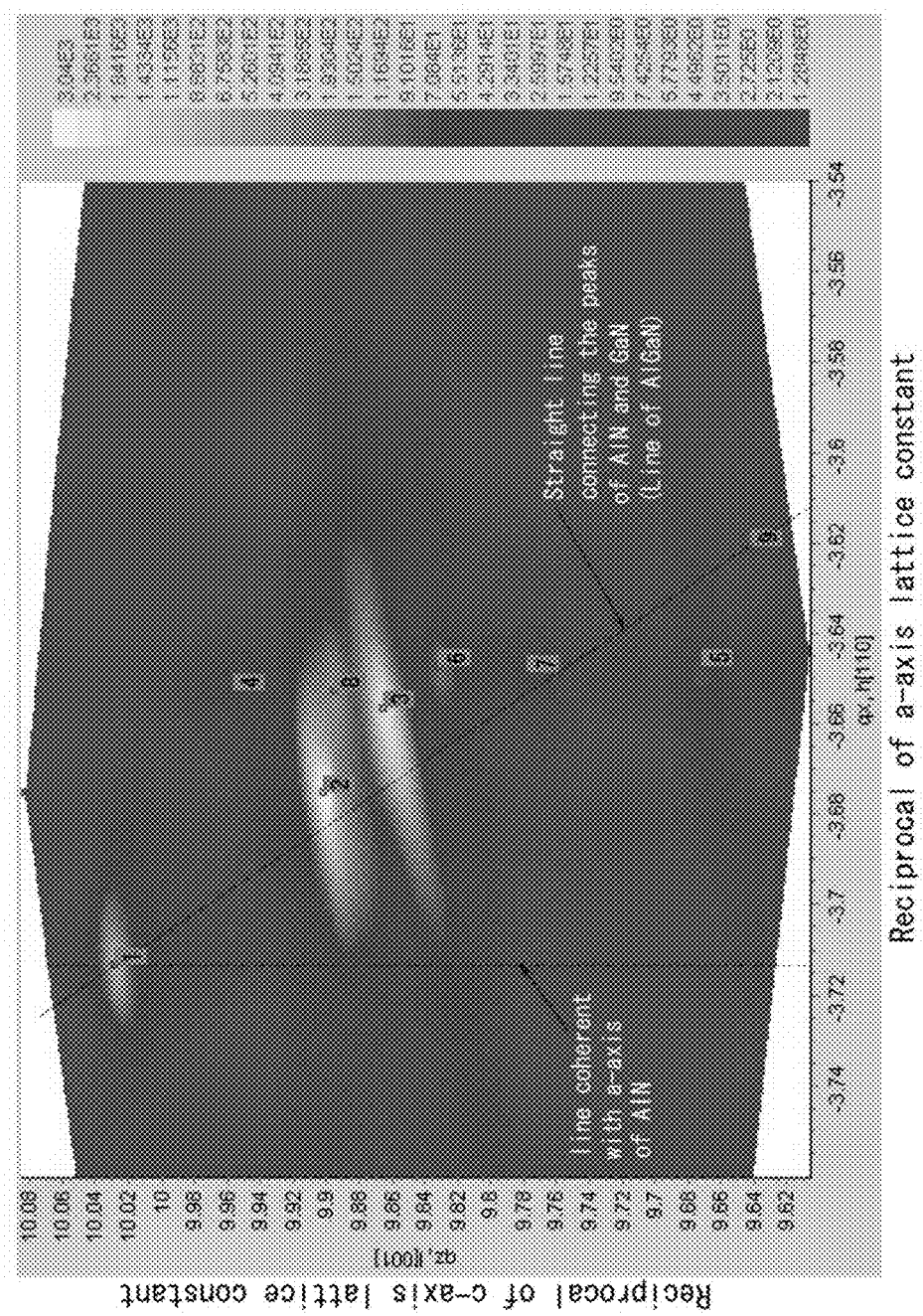
FIG. 9 is a view showing a reciprocal lattice space mapping of a III nitride semiconductor light emitting device according to Comparative Example 3 (Test Example 6)

In order to describe the crack formation in more detail, the measurement results of the reciprocal lattice space mapping of the III nitride semiconductor light emitting devices of Test Example 1 (Example 1) and Text Example 6 (Comparative Example 3) are shown in FIG. 8 and FIG. 9, respectively as exemplary examples. Note that the reciprocal lattice space mapping was performed as described below. An ω stage was moved at a predetermined angle using a one-dimensional detector having an angular aperture of 10° and an angular resolution of 0.006°, and the peak intensity profile was measured in the 2θ range of 10° using the one-dimensional detector. Next, the ω stage was moved by 0.1° and the peak intensity profile was measured again in the 2θ range of 10° using the one-dimensional detector. This was repeated to obtain the mapping data. Note that the e measurement was performed at intervals of 0.01° at an angle within the range of 31.5° to 35.7°, and the 2θ measurement was performed at an angle within the range of 104.5° to 111.5°. Here, in FIG. 8 and FIG. 9, the portion denoted by "1" shows the peak of AlN, the portion denoted by "2" shows the peak of the undoped AlGaN layer (connection layer), and the portion denoted by "3" shows the peak of the n-type AlGaN layer (n-type cladding layer). Note that the peak of the GaN composition appears in the area denoted by "9". In FIG. 8 and FIG. 9, a line that is coherent with the a-axis of AlN and an ideal line of AlGaN that is a straight line connecting the portions corresponding to the peaks of AlN and GaN are added.

In the III nitride semiconductor light emitting device according to Test Example 1 (Example 1), the lattice constant was recovered and the peak of the n-type AlGaN layer (the portion of "3") approached to the line of AlGaN, so that the tensile strain was reduced as shown in FIG. 8, which conceivably resulted in the suppression of the formation of cracks in the n-type AlGaN layer (n-type cladding layer). On the other hand, as can be seen from FIG. 9, in the III nitride semiconductor light emitting device of Test Example 6 (Comparative Example 3), the peak of the n-type AlGaN layer (the portion of "3") significantly deviated from the line of AlGaN. This is attributed to the increase in the tensile strain due to the elongated a-axis and the shortened c-axis, resulting in the formation of cracks in the n-type cladding layer.

(Evaluation 4: EL Spectrum Shape)

Figure 10:
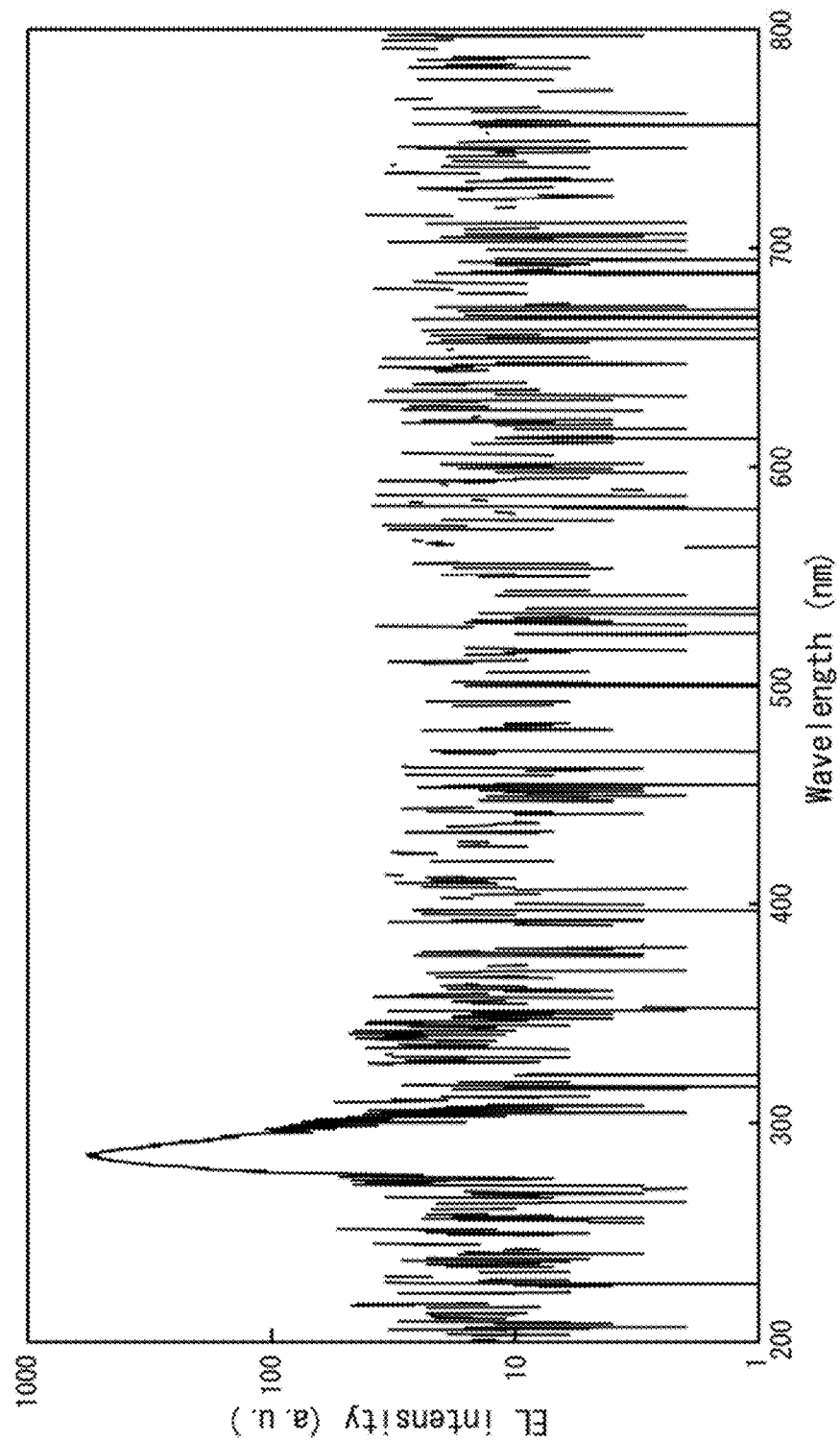
FIG. 10 is a graph showing the EL spectrum of the III nitride semiconductor light emitting device according to Example 1 (Test Example 1)
Figure 11:
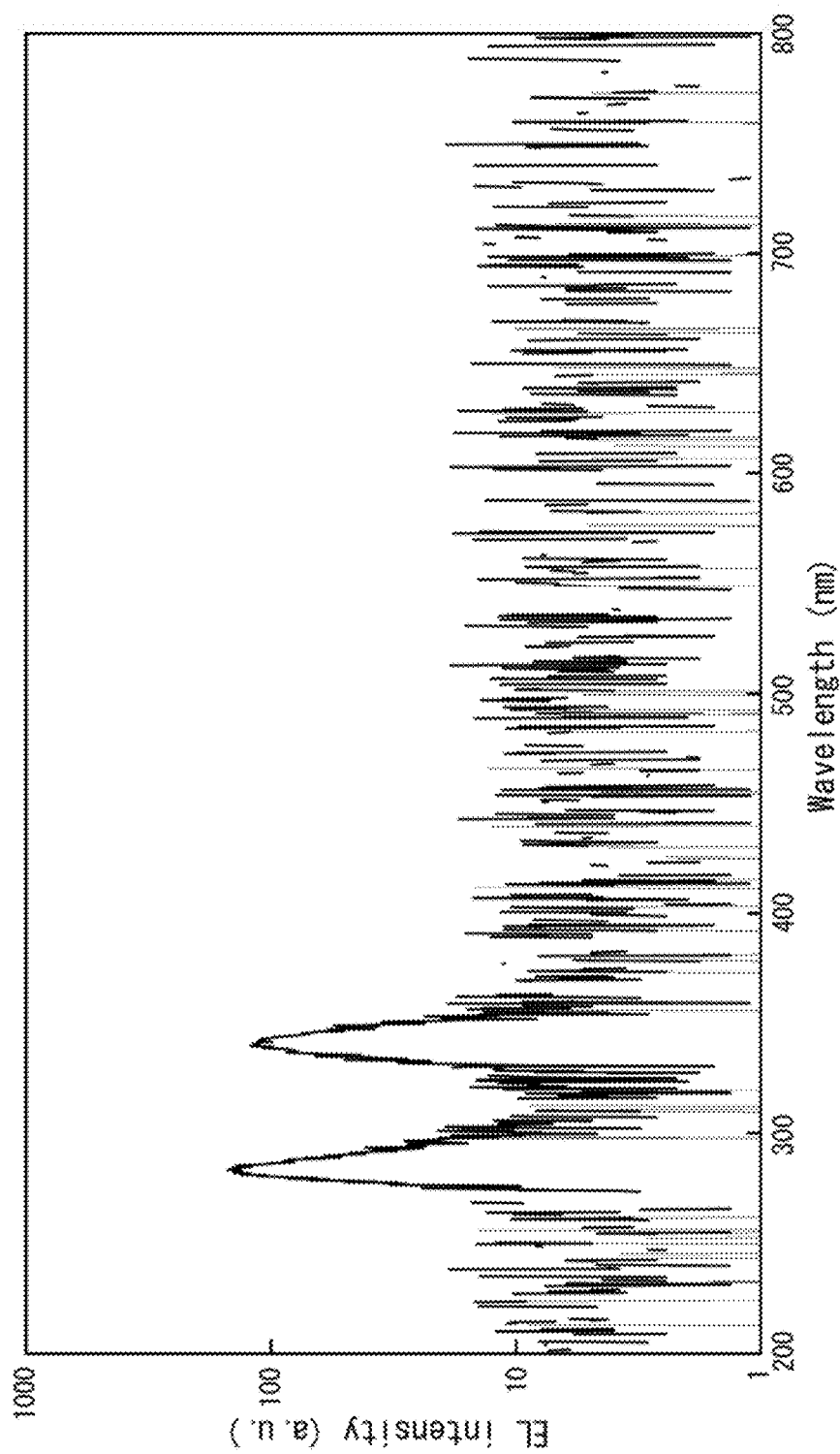
FIG. 11 is a graph showing, the EL spectrum of a III nitride semiconductor light emitting device according to Example 2 (Test Example 5)

In the III nitride semiconductor light emitting device of each test example, the crystal growth surface was scribed with a diamond pen; and two indium dots were formed by being physically pressed against a point where the n-type cladding layer (n-type AlGaN layer) was exposed and a point on the p-type contact layer 1.5 mm distant from the exposed point. A simplified nitride semiconductor device was fabricated using the thus formed two points as an n-type electrode and a p-type electrode. After probes were brought in contact with the electrodes of the electrode light emitting device, light obtained, upon the application of a direct current of 10 mA was output from the rear surface of the substrate, and the light was guided to a multi-channel spectrometer through optical fibers to measure the EL spectrum. The results are shown in Table 1. In Table 1, for the emission peak in the EL spectrum, when only one peak (projecting part) was observed at the peak wavelength expected from the composition of the active layer (light emitting layer) and any peaks at other wavelengths had low emission intensity and could be negligible, the spectrum shape is represented as "single". On the other hand, for the emission peak in the EL spectrum, when two peaks were observed, that is, when a peak at the peak wavelength expected from the composition of the active layer (light emitting layer) and a peak at a wavelength of 10 nm or more from the peak wavelength with a non-negligible level of emission intensity (for example, ⅓ or more of the intensity at the expected peak wavelength) appeared, the spectrum shape is represented as "double". Here, the EL spectrums of the III nitride semiconductor light emitting device Test Example 1 (Example 1) and Test Example 5 (Comparative Example 2) are shown in FIG. 10 and FIG. 11, respectively, as exemplary examples. The EL spectrum was single in Test Example 1 (Example 1), and as shown in FIG. 10, one peak appeared at a peak wavelength of 285 nm that was expected from the composition of the active layer. On the other hand, in Test Example 5 (Comparative Example 2), the EL spectrum was double, and as shown in FIG. 11, other than the peak at a wavelength of 285 nm, a peak appeared at a wavelength of 339 nm on the long wavelength side. Note that as is apparent from FIG. 10 and FIG. 11, the emission intensity is higher when the spectrum shape is single, than when it is double.

The III nitride semiconductor epitaxial substrates of Test Examples 1, 2, and 4 (that is, Examples 1 to 3) satisfying the disclosed conditions all had excellent surface flatness. Further, the formation of cracks was suppressed in the III nitride semiconductor light emitting devices and the EL spectrum shape was single. The III nitride semiconductor epitaxial substrates of Test Examples 1, 2, and 4 exhibited reduced warpage as compared with conventionally known III nitride semiconductor epitaxial substrates.

Meanwhile, the III nitride semiconductor epitaxial substrate and III nitride semiconductor light emitting device of Test Examples 3 and 5 to 7 (that is, Comparative Examples 1 to 4) that did not satisfy at least one or more of the disclosed conditions could not satisfy at least one or more conditions consisting of surface flatness, warpage, cracks, and EL spectrum.

These results led to the following findings.

Comparing Test Examples 1 to 3, in which only the Si concentration of the Si-doped AlN layer was different, when the Si concentration was less than $2.0 \times 10^{19}/cm^3$, double peaks were observed in the EL spectrum. Similarly, comparing Test Examples 6 and 7, in which only the Si concentration of the Si-doped AlN layer was different although the thickness was different from that in Test Examples 1 to 3, when the Si concentration was less than $2.0 \times 10^{19}/cm^3$, double peaks were observed in the EL spectrum. Thus, it was found that when the Si concentration was less than $2.0 \times 10^{19}/cm^3$, the EL spectrum was likely to have double peaks.

Comparing Test Examples 2, 4, and 5, in which only the thickness of the Si-doped AlN layer was different, in order to realize excellent surface flatness, the thickness of the Si-doped AlN layer was found to be necessarily 4 µm or more. Further, comparing Test Examples 1 and 6, in which only the thickness of the Si-doped AlN layer was different, in order to suppress the formation of cracks, the thickness of the Si-doped AlN layer was found to be necessarily 4 nm or more and 10 nm or less.

INDUSTRIAL APPLICABILITY

This disclosure provides a III nitride semiconductor epitaxial substrate having more excellent surface flatness, in which the problems of crack formation and the double peaks in the shape of the EL spectrum are mitigated; a III nitride semiconductor light emitting device; and methods of producing the same.

REFERENCE SIGNS LIST 100, 200: III nitride semiconductor epitaxial substrate
112, 212: Substrate (substrate of which at least a surface portion is made of AlN)
114, 214: Undoped AlN layer
116, 216: Si-doped AlN buffer layer
120, 220: Superlattice laminate
120A: First Al-containing layer
120B: Second Al-containing layer
130: Device formation layer
131: Connecting layer
132: N-type contact layer
133: N-type cladding layer
134: Multiple quantum well layer (MQW layer)
135: P-type cladding layer
136: P-type contact layer
141: N-side electrode
142: P-side electrode
150: III nitride semiconductor light emitting device
221: First laminate
221A: High Al-content layer ($Al_xGa_{1-x}N$)
221B: Low Al-content layer ($Al_xGa_{1-x}N$)
222: Second laminate
222A: High Al-content layer ($Al_xGa_{1-x}N$)
222B: Low Al-content layer ($Al_yGa_{1-y}N$)
223: Third laminate
223A: High Al-content layer ($Al_xGa_{1-x}N$)
223B: Low Al-content layer ($Al_yGa_{1-y}N$)

The invention claimed is:

1. A III nitride semiconductor epitaxial substrate comprising:
a substrate of which at least a surface portion is made of AlN;
an undoped AlN layer formed on the substrate;
an Si-doped AlN buffer layer formed on the undoped AlN layer; and
a superlattice laminate formed on the Si-doped AlN buffer layer,
wherein the Si-doped AlN buffer layer has an Si concentration of $2.0\times10^{19}/cm^3$ or more and a thickness in a range of 4 nm to 10 nm,
the superlattice laminate is formed by (i) stacking high Al-content layers represented by $Al_xGa_{1-x}N$, where x is an average composition in a crystal growth direction and x satisfies $0.9<x\leq1$, on the Si-doped AlN buffer layer and (ii) alternately stacking n sets, where n is an integer satisfying $4\leq n\leq10$, of low Al-content layers and the high Al-content layers, each of the low Al-content layers being represented by $Al_yGa_{1-y}N$, where y is an average composition in the crystal growth direction and y satisfies $0<y<x$, and
the first to (n−2)th low Al-content layers from the Si-doped AlN buffer layer side have a first thickness, the (n−1)th low Al-content layer has a second thickness larger than the first thickness, and the nth low Al-content layer has a third thickness equal to or larger than the second thickness.

2. The III nitride semiconductor epitaxial substrate according to claim 1, wherein the low Al-content layers are composition graded layers in which the Al composition decreases along the crystal growth direction.

3. The III nitride semiconductor epitaxial substrate according to claim 1, wherein the high Al-content layers are AlN layers, where x=1.

4. The III nitride semiconductor epitaxial substrate according to claim 1, wherein the third thickness is larger than the second thickness.

5. The III nitride semiconductor epitaxial substrate according to claim 1, wherein the high Al-content layers have the same thickness.

6. A III nitride semiconductor light emitting device comprising:
the III nitride semiconductor epitaxial substrate according to claim 1; and
an n-type cladding layer, an active layer, and a p-type cladding layer, in this order, on the substrate.

7. A method of producing a III nitride semiconductor epitaxial substrate, comprising the steps of:
forming an undoped AlN layer on a substrate of which at least a surface portion is made of AlN;
forming an Si-doped AlN buffer layer on the undoped AlN layer; and
forming a superlattice laminate on the Si-doped AlN buffer layer,
wherein in the step of forming the Si-doped AlN buffer layer, Si doping is performed such that an Si concentration of $2.0\times10^{19}/cm^3$ or more is achieved and a thickness of the Si-doped AlN buffer layer is in a range of 4 nm to 10 nm,
the superlattice laminate is formed by (i) stacking high Al-content layers represented by $Al_xGa_{1-x}N$, where x is an average composition in a crystal growth direction and x satisfies $0.9<x\leq1$, on the Si-doped AlN buffer layer and (ii) alternately stacking n sets, where n is an integer satisfying $4\leq n\leq10$, of low Al-content layers and the high Al-content layers, each of the low Al-content layers being represented by $Al_yGa_{1-y}N$, where y is an average composition in the crystal growth direction and y satisfies $0<y<x$, and
the first to (n−2)th low Al-content layers from the Si-doped AlN buffer layer side have a first thickness, the (n−1)th low Al-content layer has a second thickness larger than the first thickness, and the nth low Al-content layer has a third thickness equal to or larger than the second thickness.

8. A method of producing a III nitride semiconductor light emitting device comprising a step of sequentially forming an n-type cladding layer, an active layer, and a p-type cladding layer on the III nitride semiconductor epitaxial substrate according to claim 7.

* * * * *